(12) United States Patent
Scala et al.

(10) Patent No.: US 11,028,500 B2
(45) Date of Patent: Jun. 8, 2021

(54) INGOT PULLER APPARATUS THAT INCLUDE A DOPING CONDUIT WITH A POROUS PARTITION MEMBER FOR SUBLIMING SOLID DOPANT

(71) Applicant: GLOBALWAFERS CO., LTD., Hsinchu (TW)

(72) Inventors: Roberto Scala, Merano (IT); Stephan Haringer, Ciardes (IT); Franco Battan, Merano (IT)

(73) Assignee: GlobalWafers Co., Ltd., Hsinchu (TW)

(*) Notice: Subject to any disclaimer, the term of this patent is extended or adjusted under 35 U.S.C. 154(b) by 76 days.

(21) Appl. No.: 16/220,060

(22) Filed: Dec. 14, 2018

(65) Prior Publication Data

US 2020/0190690 A1   Jun. 18, 2020

(51) Int. Cl.
*C30B 15/14* (2006.01)
*C30B 15/20* (2006.01)
*C30B 29/06* (2006.01)

(52) U.S. Cl.
CPC .............. *C30B 15/20* (2013.01); *C30B 15/14* (2013.01); *C30B 29/06* (2013.01)

(58) Field of Classification Search
CPC ......... C30B 15/00; C30B 15/02; C30B 15/04; C30B 15/14; C30B 35/00
See application file for complete search history.

(56) References Cited

U.S. PATENT DOCUMENTS

| | | | |
|---|---|---|---|
| 6,059,876 A | 5/2000 | Yin et al. | |
| 6,312,517 B1 | 11/2001 | Banan et al. | |
| 7,132,091 B2 | 11/2006 | Kulkarni et al. | |
| 7,404,856 B2 | 7/2008 | Haga et al. | |
| 2003/0061985 A1 | 4/2003 | Kulkarni et al. | |
| 2009/0145350 A1 | 6/2009 | Narushima et al. | |
| 2009/0314996 A1 | 12/2009 | Kawazoe et al. | |
| 2010/0031871 A1 | 2/2010 | Narushima et al. | |
| 2010/0132829 A1 | 6/2010 | Javidi et al. | |
| 2010/0175612 A1 | 7/2010 | Narushima et al. | |
| 2010/0294999 A1 | 11/2010 | Narushima et al. | |
| 2012/0056135 A1 | 3/2012 | DeLuca | |
| 2014/0033968 A1 | 2/2014 | Giannattasio et al. | |

(Continued)

FOREIGN PATENT DOCUMENTS

| JP | H03271188 A | 12/1991 |
|---|---|---|
| JP | 2001342094 A | 12/2001 |
| JP | 2010064930 A | 3/2010 |

(Continued)

OTHER PUBLICATIONS

Kahler, Uew, Darstellung, Charakterisierung and Oberflachenmodifizierung von Siliziumnanopartikeln in SiO2; University of Halle, pp. 2, 2001.

(Continued)

*Primary Examiner* — Robert M Kunemund

(74) *Attorney, Agent, or Firm* — Armstrong Teasdale LLP

(57) ABSTRACT

Ingot puller apparatus for preparing silicon ingots that include a dopant feed system are disclosed. The dopant feed system include a dopant conduit having a porous partition member disposed across the dopant conduit. Solid dopant falls onto the partition member where it sublimes. The sublimed dopant is carried by inert gas through the partition member to contact and dope the silicon melt.

20 Claims, 4 Drawing Sheets

(56) References Cited

U.S. PATENT DOCUMENTS

| | | | |
|---|---|---|---|
| 2015/0107509 A1* | 4/2015 | Fukuda | C30B 29/06 117/19 |
| 2018/0044814 A1 | 2/2018 | Haringer et al. | |

FOREIGN PATENT DOCUMENTS

| | | |
|---|---|---|
| JP | 2010143776 A | 7/2010 |
| JP | 4530483 B2 | 8/2010 |
| JP | 2011132043 A | 7/2011 |
| JP | 2012066965 A | 4/2012 |
| JP | 2013129551 A | 7/2013 |
| WO | 0186033 A1 | 11/2001 |
| WO | 2014141309 A1 | 9/2014 |

OTHER PUBLICATIONS

Lide, D.R., CRC Handbook of Chemistry and Physics, 88th Edition, 2007-2008; pp. 4.

Lisak, A. et al., Vapor Pressure Measurements of Arsenic and Arsenic Trioxide Over Condensed Phases, Journal of Phase Equilibria, 1994, p. 151, vol. 15, No. 2.

Narayan, R., Advances in Bioceramics and Porous Ceramic IV, Ceramic Engineering and Science Proceedings, 2011, pp. 169-170, vol. 32, Issue 6.

International Search Report and Written Opinion of the International Searching Authority in PCT/T2013/000077, dated Nov. 26, 2013; 14 pgs.

Co-Owned U.S. Appl. No. 16/220,058 entitled "Methods for Preparing a Doped Ingot", filed Dec. 14, 2018, 29 pgs.

www.heraeus-quarzglas.de, "Porous Quartz Filter Discs", Heraeus, Apr. 2018, 2 pgs.

* cited by examiner

INGOT PULLER APPARATUS THAT INCLUDE A DOPING CONDUIT WITH A POROUS PARTITION MEMBER FOR SUBLIMING SOLID DOPANT

CROSS-REFERENCE TO RELATED APPLICATION

This application incorporates herein by reference U.S. Non-provisional patent application Ser. No. 16/220,058, published as U.S. Patent Publication No. 2020/0190689, entitled "Methods for Preparing a Doped Ingot", filed Dec. 14, 2018.

FIELD OF THE DISCLOSURE

The field of the disclosure relates to ingot puller apparatus that include a dopant feed system for preparing a doped silicon ingot and, in particular, dopant feed systems having a dopant conduit with a porous partition member disposed across the dopant conduit.

BACKGROUND

Single crystal silicon, which is the starting material for most processes for the fabrication of semiconductor electronic components, is commonly prepared by the so-called Czochralski ("Cz") method. In this method, polycrystalline silicon ("polysilicon") is charged to a crucible and melted, a seed crystal is brought into contact with the molten silicon, and a single crystal is grown by slow extraction.

In some applications, an amount of dopant is added to the melt to achieve a desired resistivity in the silicon crystal. Conventionally, dopant is fed into the melt from a feed hopper located a few feet above the silicon melt level. However, this approach is not favorable for volatile dopants because such dopants tend to vaporize uncontrolled into the surrounding environment, resulting in the generation of oxide particles (i.e., sub-oxides) that can fall into the melt and become incorporated into the growing crystal. These particles can act as heterogeneous nucleation sites, and ultimately result in failure of the crystal pulling process.

Some known dopant systems introduce volatile dopants into the growth chamber as a gas. However, such systems must be manually refilled each time a doping procedure is performed. Additionally, such systems cannot be refilled while in use. As a result, such systems have a limited dopant payload capacity for a single growth process. Such systems therefore limit the size of silicon ingots that can be grown. Furthermore, such systems tend to supply dopant non-uniformly during a growth process, thereby increasing the variation in dopant concentration along a grown ingot's longitudinal axis.

Other known systems introduce dopant into an evaporation receptacle near the melt to vaporize dopant. When volatile dopants are used, solid dopant granules may move vigorously and be ejected from the evaporation receptacle causing them to fall into the melt, reducing the consistency of the dopant process.

A need exists for improved dopant feed systems for doping a silicon melt to produce a doped silicon ingot by the Czochralski method.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect of the present disclosure is directed to an ingot puller apparatus for producing a silicon ingot. The ingot puller apparatus includes a crucible for holding a melt of silicon and a growth chamber for pulling a silicon ingot from the melt. The ingot puller apparatus includes a dopant conduit for introducing dopant into the melt. The dopant conduit includes one or more sidewalls. The one or more sidewalls form a conduit chamber through which dopant passes. The conduit chamber has a width. The dopant conduit includes an inlet through which solid dopant is introduced into the dopant conduit. The conduit chamber includes an outlet through which a gaseous dopant is discharged through the dopant conduit. The dopant conduit includes a partition member disposed between the inlet and the outlet of the dopant conduit that supports solid dopant introduced through the inlet. The partition member extends across the width of the conduit chamber.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

Figure 1:
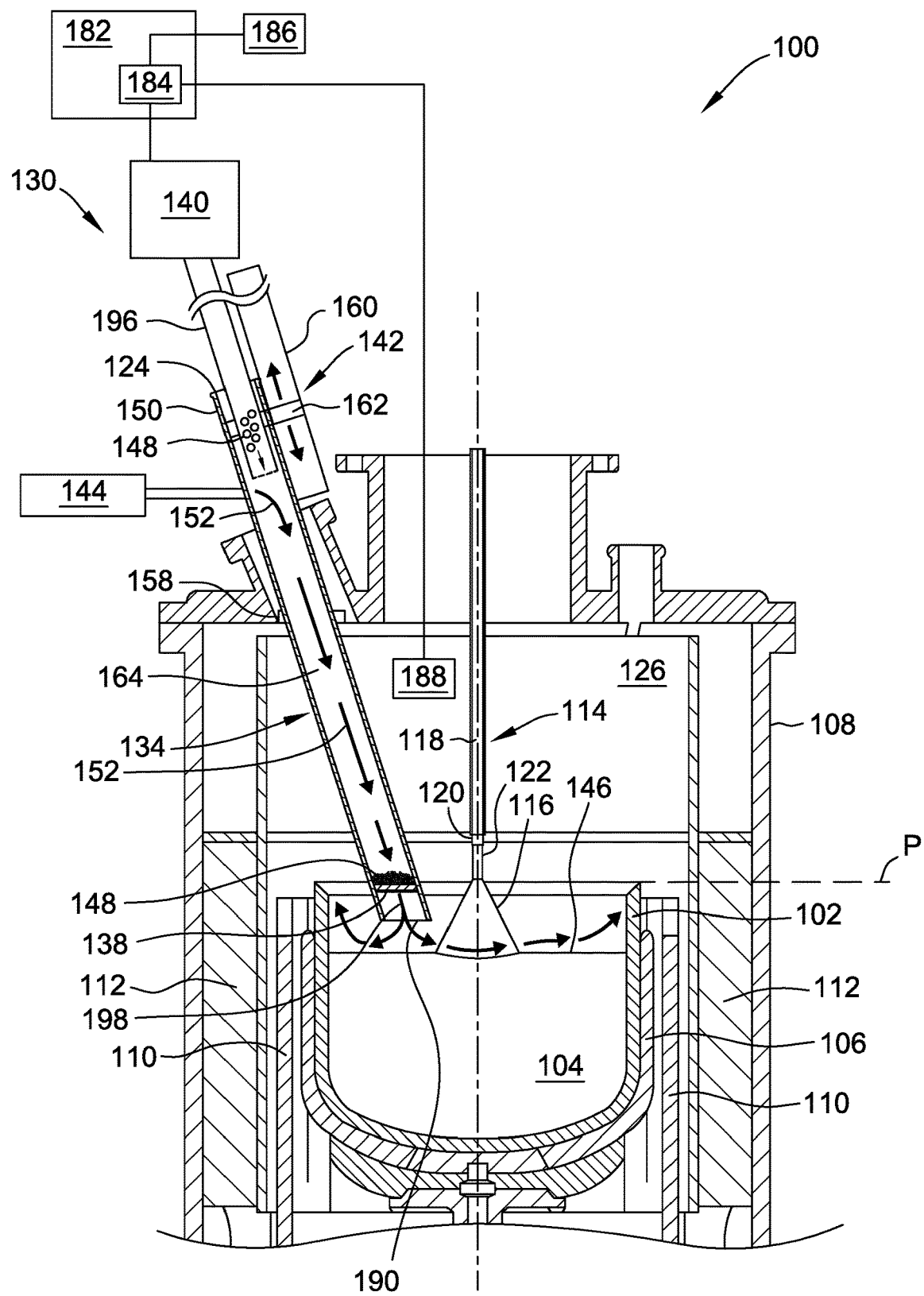
FIG. 1 is a cross-section view of an ingot puller apparatus having a dopant feed system.

An ingot puller apparatus (or more simply "ingot puller") is indicated generally at "100" in FIG. 1. The ingot puller apparatus 100 includes a crucible 102 for holding a melt 104 of semiconductor or solar-grade material, such as silicon, surrounded by a susceptor 106. The ingot puller apparatus 100 includes a crystal puller housing 108 that defines a growth chamber 126. The semiconductor or solar-grade material is melted by heat provided from one or more heating elements 110 surrounded by insulation 112.

A pulling mechanism 114 is provided within ingot puller apparatus 100 for growing and pulling ingots 116 out of the melt 104. Pulling mechanism 114 includes a pulling cable 118, a seed holder or chuck 120 coupled to one end of pulling cable 118, and a seed crystal 122 coupled to the seed holder or chuck 120 for initiating crystal growth.

The ingot puller apparatus 100 also includes a dopant feed system 130 for introducing gaseous dopant into the melt 104. The dopant feed system 130 includes a dopant conduit 134 and a partition member 138. In the illustrated embodiment, the dopant feed system 130 also includes a dopant feeding device 140, a positioning system 142, and an inert gas source 144. Generally, the dopant feed system 130 is configured to sublime solid dopant (e.g., dopant granules) and cause gaseous dopant to flow across a melt surface 146. Gaseous dopant may be introduced into the ingot puller 100 before crystal growth commences and/or during crystal growth, as shown in FIG. 1.

In operation, a solid dopant 148, such as arsenic, phosphorous, or any other element or compound with a suitably low sublimation or evaporation temperature that enables the dopant feed system to function as described herein, is introduced into the dopant conduit 134 through an inlet 124 positioned toward a first end 150 of the conduit 134. Solid dopant 148 falls downwardly through the dopant conduit 134, passes through a conduit chamber 164, and comes to rest on a porous partition member 138. Heat supplied to the conduit 134 causes the solid dopant 148 resting on the partition member 138 to vaporize into a gaseous dopant. The gaseous dopant mixes with an inert gas 152, supplied by inert gas source 144, which passes through the dopant conduit 134 and passes through the porous partition member 138. The inert gas having dopant mixed therein or "doped inert gas" 198 flows out of the dopant conduit 134 through outlet 190 and across the melt surface 146.

As solid dopant 148 is consumed by vaporization, more solid dopant 148 may be fed into the dopant conduit 134 by the feeding device 140. By continuously or intermittently supplying solid dopant 148 to the dopant conduit 134, a relatively constant concentration of gaseous dopant may be maintained above the melt surface 146 during the doping process and/or the crystal growth process.

Figure 2:
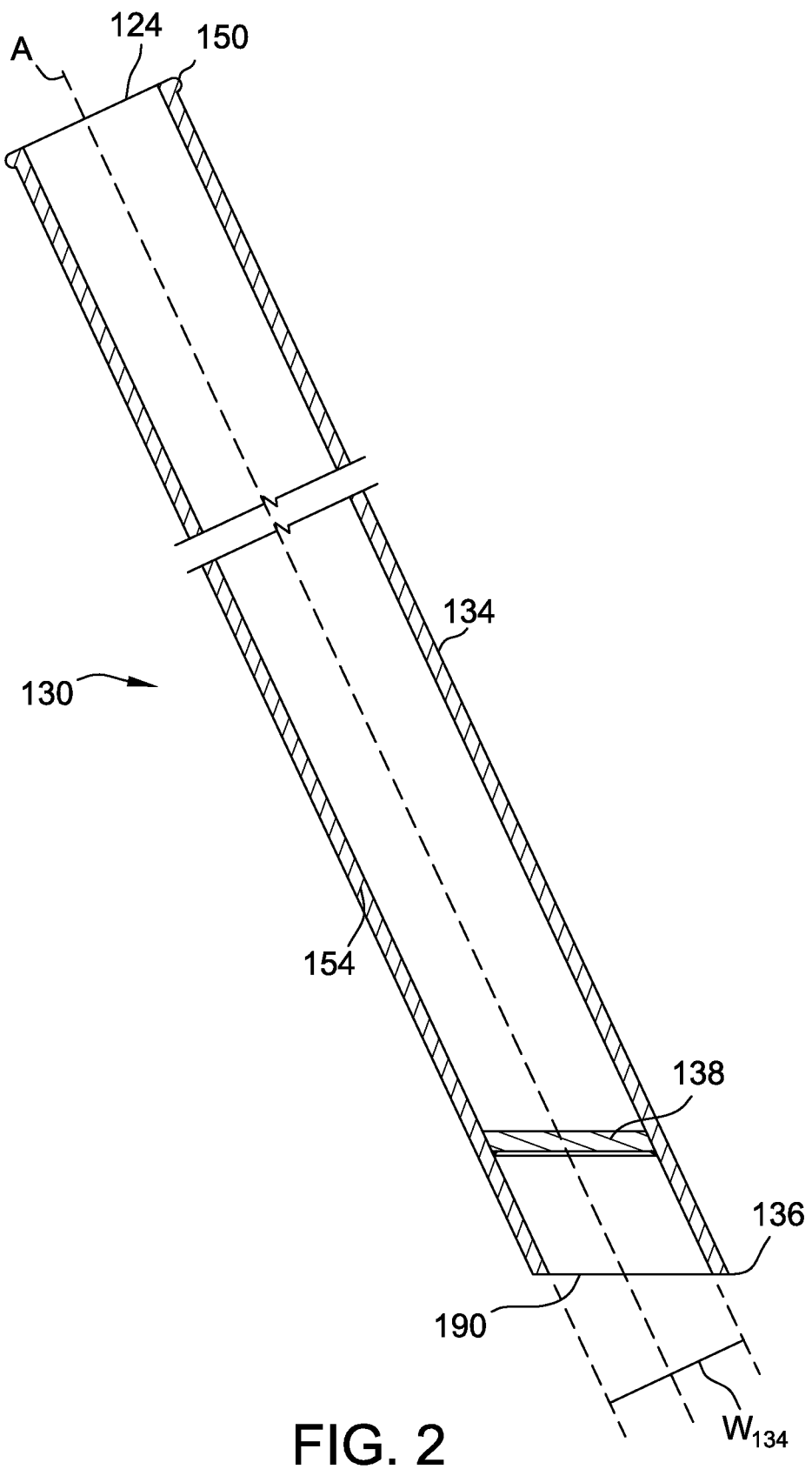
FIG. 2 is a cross-section front view of a dopant conduit of the dopant feed system.

Referring now to FIG. 2, dopant conduit 134 includes a dopant conduit sidewall 154 and includes an inlet 124 near a first end 150 of the sidewall 154 through which solid dopant 148 is introduced. The conduit 134 includes an outlet 190 near a second end 136 of the sidewall 154 through which gaseous dopant is discharged from the conduit 134. In the embodiment shown in FIGS. 1-3, the dopant conduit 134 has a generally cylindrical shape defined by a single dopant conduit sidewall 154. Generally, the dopant conduit 134 may have any suitable shape and/or any number of dopant conduit sidewalls that enable dopant feed system 130 to function as described herein (e.g., may be circular, oval, triangular, square, or rectangle in cross-section). In some embodiments, the sidewall 154 is made of quartz.

The dopant conduit 134 has a width $W_{134}$ and the partition member 138 extends across the width $W_{134}$ of the conduit 134 to catch all solid dopant that falls through the conduit chamber 164 (i.e., the partition member 138 fully extends across the conduit 134 to occlude the chamber 164). In embodiments in which the conduit 134 is cylindrical, the partition member 138 is a disk having a diameter at least the diameter of the conduit chamber 164). The partition member 138 is disposed between the conduit inlet 124 and the outlet 190 and may be closer to the outlet 190 (e.g., within about the last 25% of the length of the conduit or about the last 10% or about the last 5% of the length of the conduit). The partition member 138 may have any suitable thickness that allows the partition member 138 to support dopant while allowing doped inert gas to pass through the partition member 138.

The partition member 138 may be configured (e.g., be porous) to enable sublimed dopant to pass through the partition member 138 and toward the melt 104. In some embodiments, the partition member 138 has a nominal maximum pore size of less than about 1 mm, less than about 750 µm, less than about 675 µm, less than about 600 µm, less than about 500 µm or less than about 400 µm, from about 10 µm to about 1 mm, from about 10 µm to about 750 µm or from about 10 µm to about 750 µm. In some embodiments, the partition member 138 is made of quartz (e.g., type 00, type 0, type 1, type 2, or the like). The partition member 138 and dopant conduit 134 may be made from separate components with the partition member 138 being welded or otherwise connected to the sidewall(s) of the dopant conduit 134.

The dopant conduit 134 is positioned within the crystal puller housing 108 (FIG. 1), and extends through a valve assembly 158 and outside of the housing 108. In the embodiment shown in FIG. 1, the dopant conduit 134 is slidingly coupled to a positioning system 142. The positioning system 142 is configured to raise and/or lower the dopant conduit 134. The positioning system 142 includes a rail 160, a coupling member 162, and a motor (not shown) configured to move coupling member 162 along the rail 160. The rail 160 extends in a direction substantially parallel to the longitudinal axis A (FIG. 2) of the dopant conduit 134. The coupling member 162 is slidingly coupled to the rail 160 and is affixed to dopant conduit 134. The dopant conduit 134 may move relative to a feed conduit 196 that extends into the inlet 124 of the dopant conduit 134. Using the positioning system 142, the dopant conduit 134 may be raised and lowered into and out of the ingot puller apparatus 100. In other embodiments, the dopant conduit 134 may be positioned wholly within the housing. In some embodiments, the dopant conduit 134 is permanently attached to the ingot puller apparatus 100 (e.g., by connecting a tube housing to the puller housing 108). In yet other embodiments, the dopant conduit 134 may be positioned within and/or secured within or outside the housing 108 in any manner that enables the dopant feed system 130 to function as described herein.

In the embodiment shown in FIGS. 1 and 2, the dopant conduit 134 is angled with respect to the melt surface 146 to facilitate the distribution of gaseous dopant across the melt surface 146. The dopant conduit 134 is angled such that the longitudinal axis A (FIG. 2) of the dopant conduit 134 forms an angle (i.e., acute angle) of between about 45 degrees and about 90 degrees with respect to the melt surface 146 and/or to a horizontal plane P that extends across a top of the crucible 102. In other embodiments, the angle formed between the longitudinal axis A of the dopant conduit 134 and the melt surface 146 and/or the horizontal plane P is between about 45 degrees and about 75 degrees.

Figure 3:
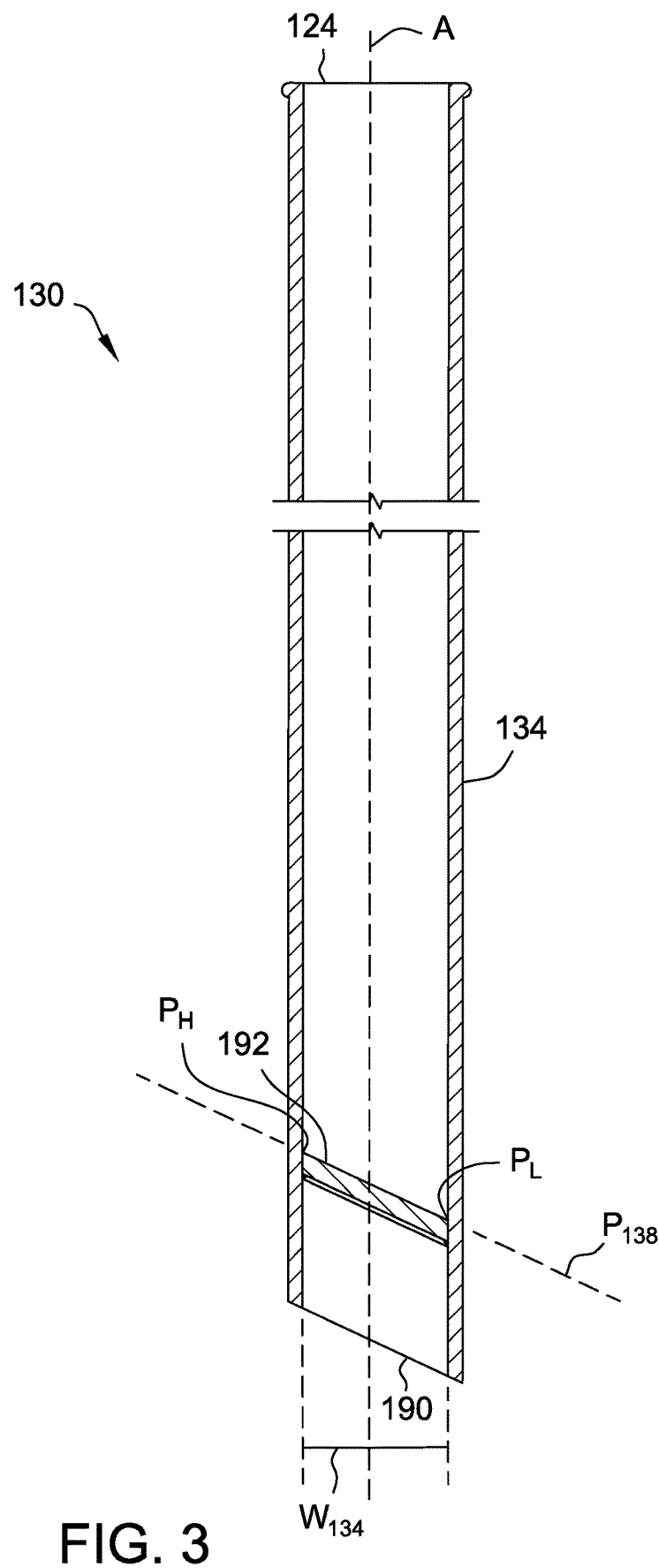
FIG. 3 is side view of the dopant conduit rotated from the position of FIG. 2.

The partition member 138 may be angled with respect to the longitudinal axis A of the dopant conduit 134. As shown in FIG. 3, the partition member 138 has a supporting surface 192. The supporting surface 192 has an uppermost point $P_H$ and a lowermost point $P_L$ relative to the longitudinal axis A. The uppermost and lowermost points $P_H$, $P_L$ define a plane $P_{138}$ that extends through the uppermost and lowermost points $P_H$, $P_L$. The longitudinal axis A of the conduit 134 and the plane $P_{138}$ form an angle between about 45 degrees and about 90 degrees (e.g., between 45 degrees and 90 degrees). In some embodiments, this angle is the same as the angle formed between the dopant conduit 134 and the melt surface 146 to allow the partition member 138 to be substantially parallel to the melt surface 146 (and to the horizontal plane P that extends across a top of the crucible 102 and to the outlet 190 of the conduit 134).

The outlet 190 of the dopant conduit 134 may also be angled with respect to the longitudinal axis A of the conduit 134 to facilitate the distribution of gaseous dopant across melt surface 146. For example, the outlet 190 may be angled such that outlet 190 is substantially parallel to the melt surface 146, and angled at an angle of between about 45 degrees and about 75 degrees with respect to longitudinal axis A of the dopant conduit 134. In other embodiments, the dopant conduit 134 is positioned substantially perpendicular to the melt surface 146 such that the longitudinal axis A of the dopant conduit 134 forms an angle of about 90 degrees with respect to the melt surface 146 and/or horizontal plane P that extends across a top of the crucible 102. The arrangement of the dopant conduit 134, outlet 190, and partition member 138 shown in the illustrated embodiment is exemplary and the dopant conduit 134, outlet 190, and partition member 138 may have any suitable configuration or orientation that enables dopant feed system 130 to function as described herein.

In this embodiment, the dopant conduit 134 is in fluid communication with an inert gas source 144 to carry gaseous dopant out of the conduit 134 through the outlet 190 and toward the melt 104. Inert gas may reduce or eliminate back flow of sublimed dopant in the upper portion of the dopant conduit 134 and other upstream components of the dopant feed system 130 (e.g., to reduce build-up of flammable phosphorous). An inert gas 152 may be introduced into the dopant conduit 134 from the inert gas source 144 at a given flow rate, such that the inert gas 152 flows downwardly towards the outlet 190 of the conduit 134. For example, inert gas flow rates of less than about 10 normal-liters per minute, less than about 5 normal-liters per minute, or even less than about 2 normal-liters per minute can be used while maintaining a sufficient supply of gaseous dopant to the melt surface 146. The inert gas 152 may be argon, although any other suitable inert gas may be used that enables the dopant feed system 130 to function as described herein. The flow rate of the inert gas within the conduit chamber 164 may be controlled based, as least in part, on the sublimation rate of the dopant to prevent backflow of dopant through the dopant conduit 134.

In some embodiments, the dopant conduit 134 does not include flow restrictors that restrict the flow of inert gas 152 in the conduit 134 and/or does not include vertical partitions such as partitions connected to the partition member 138 to divide the conduit 134 into additional chambers or receptacles.

The dopant conduit 134 may be communicatively coupled to a dopant feeding device 140 configured to feed solid dopant 148 into the dopant conduit 134. The dopant feeding device 140 may be automated or, as in other embodiments, may be manually operated, or only partially automated. The feeding device 140 may be configured to automatically feed solid dopant 148 into the dopant conduit 134 based upon one or more user-defined parameters, and/or environment-specific parameters. For example, the automated feeding device 140 may feed solid dopant 148 into the dopant conduit 134 based upon any one or more of the following parameters: preset time(s) during a growth process, user defined interval(s), the mass of solid dopant 148 within dopant conduit 134, a concentration of gaseous dopant within the conduit chamber 164, and a volumetric or mass flow rate of gaseous dopant and/or inert gas 152. The continuous and/or intermittent feeding of solid dopant 148 to conduit 134 enables a relatively constant gaseous dopant concentration to be maintained within the growth chamber 126 during the crystal growth process, resulting in a more uniform dopant concentration profile in grown ingots.

The feeding device 140 may be coupled to a controller 182 configured to control the frequency and/or amount of solid dopant 148 being fed into the dopant conduit 134 by the feeding device 140. The controller 182 includes a processor 184 configured to send and receive signals to and from controller 182 and/or feeding device 140 based on one or more user-defined parameters and/or environment-specific parameters. In this embodiment, the controller 182 includes a user interface 186 coupled to a processor 184, and a sensor 188 coupled to the processor 184. User interface 186 is configured to receive user-defined parameters, and communicate user-defined parameters to processor 184 and/or controller 182. The sensor 188 is configured to receive and/or measure environment-specific parameters, and communicate such environment-specific parameters to the processor 184 and/or controller 182.

The partition member 138 is positioned within dopant conduit 134 near the outlet 190. The partition member 138 is configured to hold solid dopant 148 and allow heat to be transferred from the melt 104 to the solid dopant 148 to vaporize dopant while allowing vaporized gas to pass through the partition member 138. The partition member 138 may be positioned sufficiently near the melt 104 such that radiant heat from the melt 104 vaporizes solid dopant 148 that falls onto the partition member 138. For example, the partition member 138 may be positioned between about 1 mm to about 15 mm above the melt surface 146. In some embodiments, the outlet 190 of the dopant conduit 134 is disposed within the melt 104 to position the partition member 138 near the melt surface 146. In other embodiments, a separate heating element (not shown) may be used to supply heat to vaporize dopant 148 therein.

Generally, the partition member 138 causes a pressure difference in the gas upstream and downstream of the partition member such that the pressure of the inert gas is reduced upon passing through the partition member 138. In some embodiments, the pressure of the inert gas is reduced by at least about 5 mbar as it passes across the partition member 138. In some instances, solid dopant 148 resting on the partition member 138 contributes to the pressure difference across the partition member 138. This allows the pressure difference to be correlated to the amount of solid dopant 148 in the dopant conduit 134. The pressure difference when no dopant is present may be used for calibration.

In accordance with embodiments of the present disclosure, a doped ingot may be prepared by an embodiment of an ingot puller apparatus 100 described above. Polycrystalline silicon is melted by heating elements 110 to form a melt of silicon in the crucible 102. Solid dopant 148 is introduced into the dopant conduit 134 through the inlet 124. The solid dopant 148 falls through the conduit 134 to partition member 138 where the solid dopant 148 comes to rest. Solid dopant 148 loaded onto the partition member 138 is heated (e.g., by radiant heat from the melt 104) to cause the solid dopant 148 to sublime.

Inert gas 152 is introduced into the conduit chamber 164 and mixes with sublimed dopant to form a doped inert gas 198. The doped inert gas 198 passes through the partition member 138 to cause dopant to contact the melt surface 146 and be absorbed into the melt 104. A doped ingot is pulled from the silicon melt having dopant therein. The ingot may be grown from a pre-loaded charge of polycrystalline silicon (e.g., a batch process) or in a continuous Czochralski process or even a semi-continuous Czochralski process.

The ingot puller apparatus of embodiments of the present disclosure has several advantages over previous ingot pullers. Use of a partition member that extends across the width of the dopant conduit allows solid dopant to sublime relatively vigorously without dopant particles falling into the melt (e.g., by jumping from an evacuation receptacle during sublimation). This is particularly advantageous for dopants that tend to sublime vigorously such as phosphorous. The partition member also increases the surface of the dopant granules exposed to radiant heat from the melt which allows for more efficient heat exchange with the ingot puller environment, reducing the time at which the ingot melt is initially doped.

EXAMPLES

The processes of the present disclosure are further illustrated by the following Examples. These Examples should not be viewed in a limiting sense.

Example 1: Stability and Repeatability by Use of the Dopant Feed System

Figure 4:
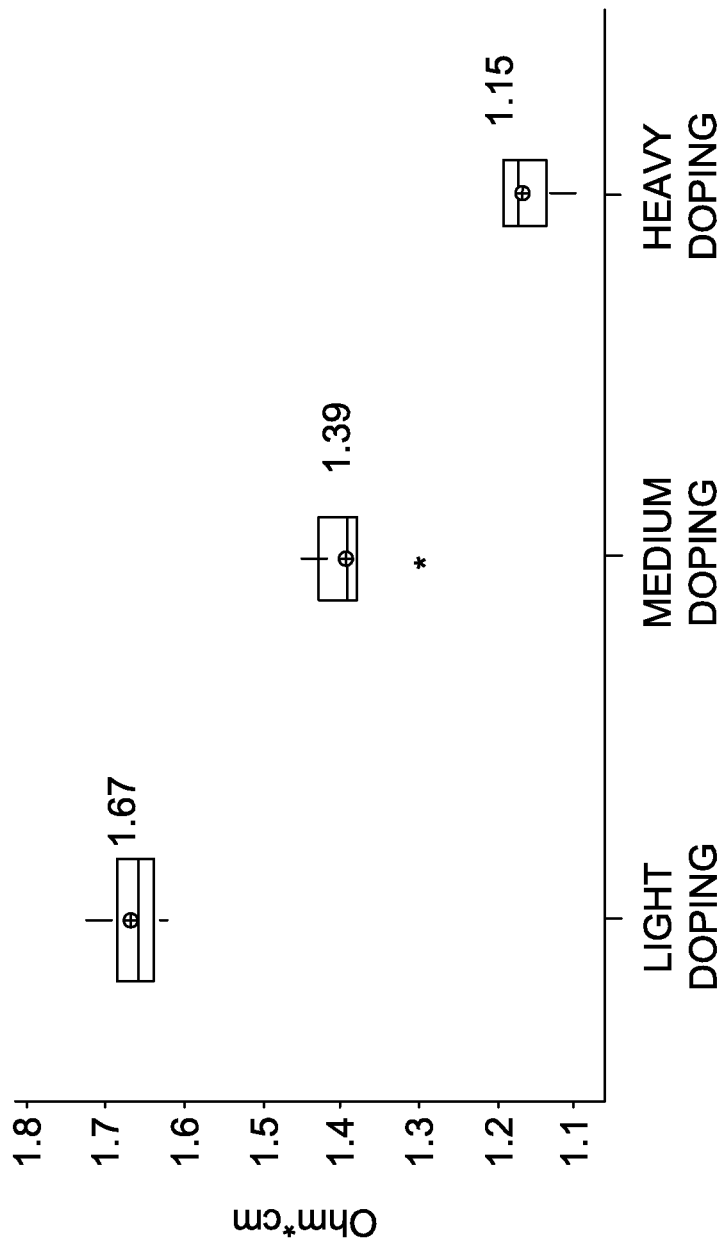
FIG. 4 is a box plot of the seed end resistivity for three dopant amounts as described in Example 1.

Single crystal silicon ingots were prepared with different amounts of phosphorous doping (light doping, medium doping, heavy doping). The silicon melt was doped before ingot growth by the dopant feed system of FIG. 1 having a dopant conduit with a partition member therein. The outlet of the dopant conduit was about 5 mm from the surface of the melt. A box plot of the distribution of the resistivity of the seed end of a number of ingots is shown in FIG. 4. As shown in FIG. 4, for all three dopant amounts, the distribution of the seed end resistivity was relatively tight which demonstrates good stability and repeatability of doping by use of the dopant feed system described herein.

The number of attempts to grow a single crystal ingot decreased by 4% when using the dopant feed system of FIG. 1 having a dopant conduit with a partition member therein. This demonstrates an improvement in repeatability and better control of resistivity at the seed end.

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment(s) thereof, the articles "a", "an", "the" and "said" are intended to mean that there are one or more of the elements. The terms "comprising," "including," "containing" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the disclosure, it is intended that all matter contained in the above description and shown in the accompanying drawing[s] shall be interpreted as illustrative and not in a limiting sense.

What is claimed is:

1. An ingot puller apparatus for producing a silicon ingot comprising:
   a crucible for holding a melt of silicon;
   a growth chamber for pulling a silicon ingot from the melt; and
   a dopant conduit for introducing dopant into the melt, the dopant conduit having a length and comprising:
   one or more sidewalls, the one or more sidewalls forming a conduit chamber through which dopant passes, the conduit chamber having a width;
   an inlet through which solid dopant is introduced into the dopant conduit;
   an outlet through which a gaseous dopant is discharged through the dopant conduit; and
   a partition member disposed between the inlet and the outlet and supporting solid dopant introduced through the inlet, the partition member extending across the width of the conduit chamber, the partition member being within the last 25% of the length of the dopant conduit.

2. The ingot puller apparatus as set forth in claim 1 wherein the partition member is porous to allow sublimed dopant to pass through the partition member and toward the melt.

3. The ingot puller apparatus as set forth in claim 2 wherein the partition member has a nominal maximum pore size of less than about 1 mm.

4. The ingot puller apparatus as set forth in claim 2 wherein the partition member has a nominal maximum pore size of less than about 500 µm.

5. The ingot puller apparatus as set forth in claim 2 wherein the partition member has a nominal maximum pore size from about 1 µm to about 1 mm.

6. The ingot puller apparatus as set forth in claim 2 wherein the partition member has a nominal maximum pore size from about 10 µm to about 750 µm.

7. The ingot puller apparatus as set forth in claim 1 wherein the dopant conduit is cylindrical and the partition member is a disk.

8. The ingot puller apparatus as set forth in claim 1 wherein the dopant conduit is oval, triangular, square, or rectangle in cross-section.

9. The ingot puller apparatus as set forth in claim 1 wherein the dopant conduit has a longitudinal axis, the crucible having a horizontal plane that extends across a top of the crucible, the longitudinal axis of the dopant conduit and the horizontal plane forming an angle of between about 45 degrees and about 90 degrees.

10. The ingot puller apparatus as set forth in claim 1 wherein the dopant conduit has a longitudinal axis, the crucible having a horizontal plane that extends across a top of the crucible, the longitudinal axis of the dopant conduit and the horizontal plane forming an angle of between about 45 degrees and about 75 degrees.

11. The ingot puller apparatus as set forth in claim 9 wherein the partition member has a supporting surface having an uppermost point and a lowermost point relative to the longitudinal axis that define a supporting surface plane that extends through the uppermost and lowermost points, the longitudinal axis of the dopant conduit and the supporting surface plane forming an acute angle between about 45 degrees to about 90 degrees.

12. The ingot puller apparatus as set forth in claim 9 wherein the partition member has a supporting surface having an uppermost point and a lowermost point relative to the longitudinal axis that define a supporting surface plane that extends through the uppermost and lowermost points, the longitudinal axis of the dopant conduit and the supporting surface plane forming an acute angle between about 45 degrees to about 75 degrees.

13. The ingot puller apparatus as set forth in claim 11 wherein the supporting surface is parallel to the horizontal plane that extends across the top of the crucible.

14. The ingot puller apparatus as set forth in claim 11 wherein the supporting surface is parallel to the outlet of the dopant conduit.

15. The ingot puller apparatus as set forth in claim 1 wherein the dopant conduit is in fluid communication with an inert gas source to introduce inert gas into the dopant conduit to mix with sublimed dopant to form a doped inert gas, the doped inert gas being discharged through the outlet of the dopant conduit.

16. The ingot puller apparatus as set forth in claim 1 in combination with solid dopant supported by the partition member, the solid dopant being arsenic.

17. The ingot puller apparatus as set forth in claim 1 in combination with solid dopant supported by the partition member, the solid dopant being phosphorous.

18. The ingot puller apparatus as set forth in claim 1 wherein ingot puller apparatus comprises a heating element for heating the crucible, the ingot puller apparatus being free of a separate heating element for heating the solid dopant.

19. The ingot puller apparatus as set forth in claim 1 wherein the partition member is within the last 10% of the length of the dopant conduit.

20. The ingot puller apparatus as set forth in claim 1 wherein the partition member is within the last 5% of the length of the dopant conduit.

* * * * *